(12) United States Patent
Shirotori et al.

(10) Patent No.: US 9,437,223 B2
(45) Date of Patent: Sep. 6, 2016

(54) MAGNETORESISTIVE ELEMENT, METHOD OF MANUFACTURING MAGNETORESISTIVE ELEMENT, MAGNETIC HEAD, AND MAGNETIC RECORDING AND READING APPARATUS

(71) Applicant: KABUSHIKI KAISHA TOSHIBA, Tokyo (JP)

(72) Inventors: Satoshi Shirotori, Kanagawa (JP); Yuuzo Kamiguchi, Kanagawa (JP); Masayuki Takagishi, Tokyo (JP); Hitoshi Iwasaki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/838,914

(22) Filed: Aug. 28, 2015

(65) Prior Publication Data

US 2016/0099014 A1 Apr. 7, 2016

(30) Foreign Application Priority Data

Oct. 1, 2014 (JP) ................. 2014-203341

(51) Int. Cl.
| | |
|---|---|
| *G11B 5/39* | (2006.01) |
| *G11B 5/127* | (2006.01) |
| *H01L 43/02* | (2006.01) |
| *H01L 43/08* | (2006.01) |
| *H01L 43/12* | (2006.01) |

(52) U.S. Cl.
CPC ........... *G11B 5/3903* (2013.01); *G11B 5/1272* (2013.01); *H01L 43/02* (2013.01); *H01L 43/08* (2013.01); *H01L 43/12* (2013.01)

(58) Field of Classification Search
None
See application file for complete search history.

(56) References Cited

U.S. PATENT DOCUMENTS

| | | | |
|---|---|---|---|
| 2004/0252416 A1* | 12/2004 | Horng ................. | B82Y 10/00 360/324.1 |
| 2008/0175044 A1 | 7/2008 | Maekawa et al. | |
| 2009/0154030 A1* | 6/2009 | Yamada ................ | B82Y 25/00 360/319 |
| 2010/0119875 A1 | 5/2010 | Sasaki | |
| 2012/0133008 A1* | 5/2012 | Yamada ................ | B82Y 10/00 257/421 |
| 2015/0029609 A1* | 1/2015 | Kamiguchi ............ | G11B 5/35 360/70 |
| 2015/0030886 A1* | 1/2015 | Shirotori .............. | G11B 5/398 428/811.2 |
| 2015/0035524 A1* | 2/2015 | Sasaki ................. | G01R 33/093 324/244 |
| 2015/0070799 A1* | 3/2015 | Dimitrov ............. | G11B 5/3903 360/235.4 |
| 2016/0099015 A1 | 4/2016 | Kamiguchi et al. | |

FOREIGN PATENT DOCUMENTS

| | | |
|---|---|---|
| JP | 2008-171945 | 7/2008 |
| JP | 2009-146512 | 7/2009 |

(Continued)

*Primary Examiner* — Will J Klimowicz
(74) *Attorney, Agent, or Firm* — Finnegan, Henderson, Farabow, Garrett & Dunner LLP

(57) ABSTRACT

A magnetoresistive element according to an embodiment includes: a multilayer element including a first magnetic layer, a magnetization direction of the first magnetic layer being pinned, a nonmagnetic layer disposed on the first magnetic layer, a second magnetic layer disposed in a first region on the nonmagnetic layer, a magnetization direction of the second magnetic layer being pinned and antiparallel to the magnetization direction of the first magnetic layer, and a third magnetic layer disposed in a second region that is different from the first region on the nonmagnetic layer near one of two opposite end faces of the nonmagnetic layer, a magnetization direction of the third magnetic layer being changeable by an external magnetic field, a lower face of the nonmagnetic layer being in contact with an upper face of the first magnetic layer.

9 Claims, 7 Drawing Sheets

(56) References Cited

FOREIGN PATENT DOCUMENTS

| | | |
|---|---|---|
| JP | 2010-113752 | 5/2010 |
| JP | 2010-113788 | 5/2010 |
| JP | 2011-104212 | 6/2011 |
| JP | 2012-234602 | 11/2012 |
| JP | 2016-71921 | 5/2016 |

* cited by examiner

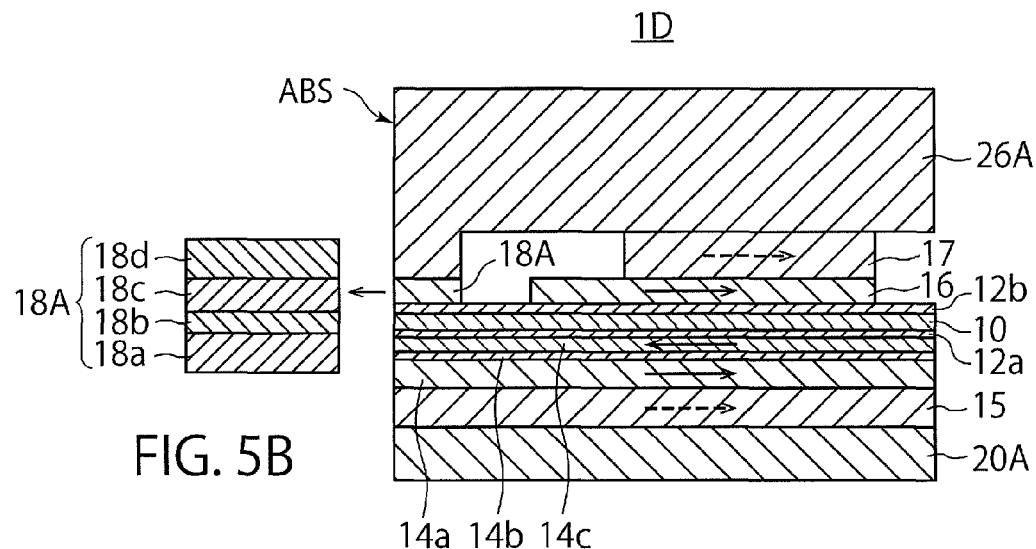
FIG. 5B
FIG. 5A
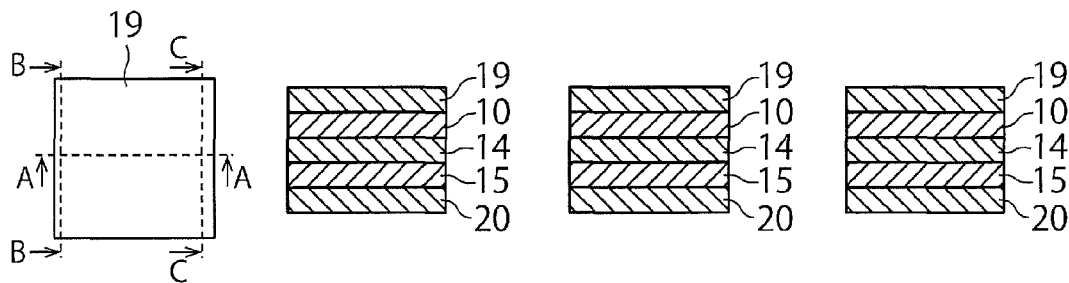
FIG. 6A  FIG. 6B  FIG. 6C  FIG. 6D
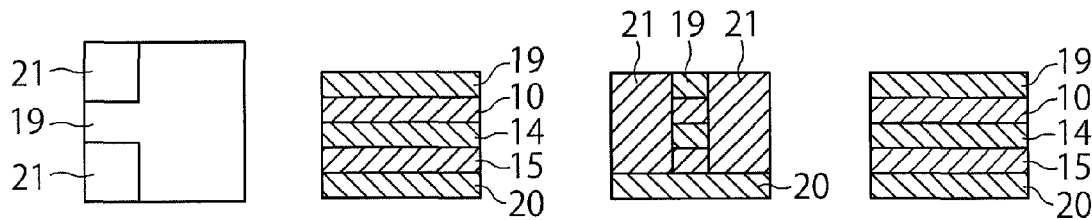
FIG. 7A  FIG. 7B  FIG. 7C  FIG. 7D

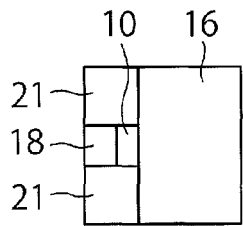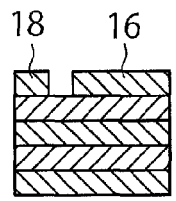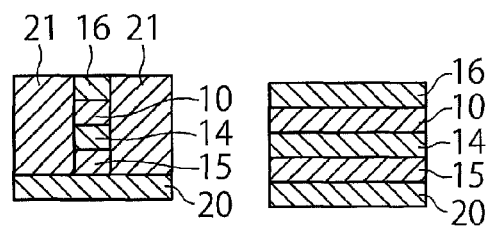
FIG. 8A  FIG. 8B  FIG. 8C  FIG. 8D
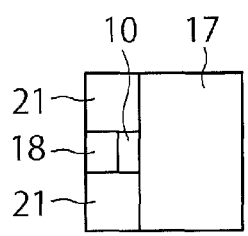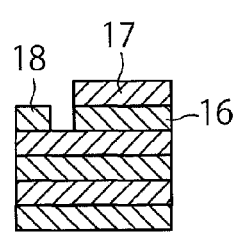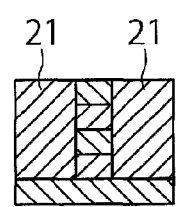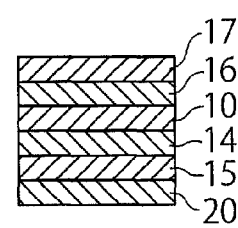
FIG. 9A  FIG. 9B  FIG. 9C  FIG. 9D
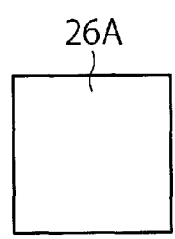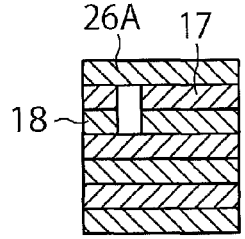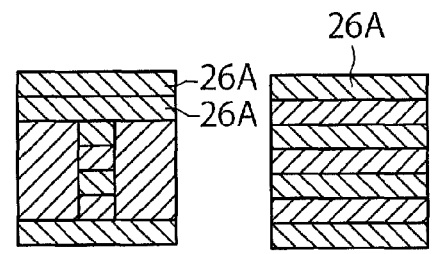
FIG. 10A  FIG. 10B  FIG. 10C  FIG. 10D

MAGNETORESISTIVE ELEMENT, METHOD OF MANUFACTURING MAGNETORESISTIVE ELEMENT, MAGNETIC HEAD, AND MAGNETIC RECORDING AND READING APPARATUS

CROSS REFERENCE TO RELATED APPLICATIONS

This application is based upon and claims the benefit of priority from prior Japanese Patent Application No. 2014-203341 filed on Oct. 1, 2014 in Japan, the entire contents of which are incorporated herein by reference.

FIELD

Embodiments described herein relate generally to a magnetoresistive element, a method of manufacturing a magnetoresistive element, a magnetic head, and a magnetic recording and reading apparatus.

BACKGROUND

The recording density of magnetic recording apparatuses is expected to achieve Tbits/inch$^2$ in the future due to the development of perpendicular magnetic recording methods and magnetic head techniques using current-perpendicular-to-plane giant-magnetoresistance (CPP-GMR) elements and tunneling magnetoresistance (TMR) elements. In order to improve the resolution in the bits-per-inch (BPI) direction (the track length direction), the gap between shields should be narrowed. However, narrowing the gap is difficult since there is an element formed of various layers such as an antiferromagnetic layer, a magnetization pinned layer, a nonmagnetic layer, and a magnetization free layer between the shields.

In order to improve the resolution in the track-per-inch (TPI) direction (the track width direction), the track width or the element size should be reduced. However, the reduction in element size may cause heat. Therefore, the element preferably has a low resistance and a high output. However, reducing the resistance of the TMR element and increasing the output of CPP-GMR element are difficult. As a result, reading heads of a Tbits/inch$^2$ level have not been obtained yet.

Reproducing heads using the spin accumulation effect have been proposed to solve these problems. Such heads, however, are difficult to increase output.

The applicant has filed a patent application for a reading head using the spin accumulation effect, which has a high output. As will be described later, the filed reading head has a problem in obtaining a good crystallinity in the nonmagnetic layer and the magnetic layers, and has a difficulty in controlling the degradation of the spin diffusion length in the nonmagnetic layer and the degradation of the polarizability in the magnetic layers.

Therefore, the compatibility is important between the design of the element structure for having advantages over conventional spin valve elements and obtaining a low resistance and a high output and the crystallinity of the nonmagnetic layers and the magnetic layers.

BRIEF DESCRIPTION OF THE DRAWINGS

FIGS. 5A and 5B are cross-sectional views showing a magnetic reading head according to a fifth embodiment.

FIGS. 6A to 6D are diagrams showing a method of manufacturing a magnetic reading head according to a sixth embodiment.

FIGS. 7A to 7D are diagrams showing the method of manufacturing a magnetic reading head according to the sixth embodiment.

FIGS. 8A to 8D are diagrams showing the method of manufacturing a magnetic reading head according to the sixth embodiment.

FIGS. 9A to 9D are diagrams showing the method of manufacturing a magnetic reading head according to the sixth embodiment.

FIGS. 10A to 10D are diagrams showing the method of manufacturing a magnetic reading head according to the sixth embodiment.

DETAILED DESCRIPTION

A magnetoresistive element according to an embodiment includes: a multilayer element including a first magnetic layer, a magnetization direction of the first magnetic layer being pinned, a nonmagnetic layer disposed on the first magnetic layer, a second magnetic layer disposed in a first region on the nonmagnetic layer, a magnetization direction of the second magnetic layer being pinned and antiparallel to the magnetization direction of the first magnetic layer, and a third magnetic layer disposed in a second region that is different from the first region on the nonmagnetic layer near one of two opposite end faces of the nonmagnetic layer, a magnetization direction of the third magnetic layer being changeable by an external magnetic field, a lower face of the nonmagnetic layer being in contact with an upper face of the first magnetic layer.

Embodiments will now be explained with reference to the accompanying drawings.

Before the embodiments are described, how the present invention was achieved will be described.

As described above, the applicant has filed a patent application for a reading head using the spin accumulation effect, which is capable of increasing the output (Japanese Patent Application No. 2013-156017). This reading head has a structure in which two magnetization pinned layers being pinned to be antiparallel to each other and an antiferromagnetic layer are moved back from the air bearing surface (ABS) of the magnetic disk, a charging current is caused to flow between the pinned layers, spin-polarized electrons are caused to reach a magnetization free layer at the ABS via a nonmagnetic layer, and a non-local voltage is measured without causing the current to flow at the free layer. This narrows the gap between the shields without reducing the output and with the magnetoresistance effect being obtained.

In order to achieve a reading head using the spin accumulation effect, the spin diffusion length of the nonmagnetic layer and the polarizability of the magnetic layer should be improved. However, this type of reading head has a more complicated element structure than conventional spin valve elements. This makes it difficult to obtain a good crystallinity in the nonmagnetic layer and the magnetic layers, and to prevent the degradation in the spin diffusion length of the nonmagnetic layer and the degradation in the polarizability of the magnetic layers.

The inventors have studied hard to obtain a magnetoresistive element and a reading head using the spin accumulation effect, in which a good crystallinity may be obtained in the nonmagnetic layers and the magnetic layers, and the degradation in the spin diffusion length in the nonmagnetic layer and the degradation in the polarizability in the magnetic layers may be prevented. Embodiments of such magnetoresistive elements and reading heads will be described below.

(First Embodiment)

Figure 1:
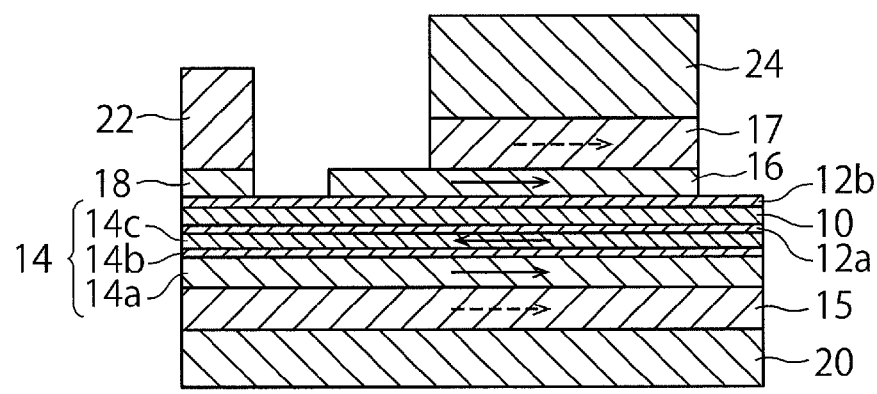
FIG. 1 is a cross-sectional view showing a magnetoresistive element according to a first embodiment.

FIG. 1 is a cross-sectional view of a magnetoresistive element according to a first embodiment. The magnetoresistive element according to the first embodiment uses the spin accumulation effect, and includes an electrode 20 serving as a magnetic shield, an antiferromagnetic layer 15 of, for example, IrMn, disposed on the electrode 20, a magnetization pinned layer (hereinafter also referred to pinned layer) 14 disposed on the antiferromagnetic layer 15, including a magnetic layer in which the magnetization direction is pinned, an interface layer 12a disposed on the pinned layer 14, a nonmagnetic layer 10 disposed on the interface layer 12a, an interface layer 12b disposed on the nonmagnetic layer 10, a pinned layer 16 disposed on a first region of the interface layer 12b, including a magnetic layer in which the magnetization direction is pinned, an antiferromagnetic layer 17 of, for example, IrMn, disposed on the pinned layer 16, an electrode serving as a magnetic shield disposed on the antiferromagnetic layer 17, a magnetization free layer (hereinafter also referred to free layer) 18 disposed on a second region of the interface layer 12b, which is different from the first region, and including a magnetic layer in which the magnetization direction is switchable, and an electrode 22 serving as a magnetic shield disposed on the free layer 18.

The pinned layer 14 includes a magnetic layer 14a disposed on the antiferromagnetic layer 15, a magnetic coupling layer 14b of, for example, Ru disposed on the magnetic layer 14a, and a magnetic layer 14c disposed on the magnetic coupling layer 14b. The magnetic layer 14a and the magnetic layer 14c are antiferromagnetically coupled with each other via the magnetic coupling layer 14b. In other words, the pinned layer 14 has a synthetic pinned structure. The interface layers 12a, 12b may be omitted. In this case, the nonmagnetic layer 10 is disposed to be in contact with the second magnetic layer 14c, and the pinned layer 16 and the free layer 18 are disposed to be in contact with the nonmagnetic layer 10.

The magnetizations of the pinned layer 14 and the pinned layer 16 are pinned by the antiferromagnetic layer 15 and the antiferromagnetic layer 17, respectively, to be antiparallel with each other. The magnetization direction of the magnetic layer of the free layer 18 is rotated freely due to the effect of an external magnetic field.

The nonmagnetic layer 10 of this embodiment is disposed on the pinned layer 14. Accordingly, substantially the entire portion of the lower surface of the nonmagnetic layer 10 is in contact with the upper surface of the pinned layer 14. The phrase "substantially the entire portion" herein means that during the manufacturing process, the entire portion of the lower surface of the nonmagnetic layer 10 is caused to be in contact with the upper surface of the pinned layer 14, but in the manufactured magnetoresistive element, the entire portion of the lower surface of the nonmagnetic layer 10 may not necessarily be in contact with the upper surface of the pinned layer 14 as long as the same effect as being obtained by this embodiment can be obtained.

In contrast, the nonmagnetic layers of conventional elements are at least partially formed on insulating films. This prevents the nonmagnetic layers from obtaining a good crystallinity, causes defects that induce spin scattering, and reduces the output. The magnetic layers on the nonmagnetic layers are also prevented from having a good crystallinity in terms of the interface flatness and the epitaxy. As a result, the spin polarization is reduced.

In this embodiment, the magnetic layer is always present under the nonmagnetic layer 10. This allows the base layer of the electrode 20, the pinned layer 14, the nonmagnetic layer 10, the pinned layer 16, and the free layer 18 to be formed at a time. Therefore, the crystallinity of this embodiment may be as good as that of TMR heads currently in use. Since the magnetic layer is always present under the entire lower surface of the nonmagnetic layer 10, the spin-polarized electrons flowing through the nonmagnetic layer 10 may be absorbed by the pinned layer 14 disposed below the nonmagnetic layer 10 before being fully diffused. However, this spin leakage may be compensated by increasing the spin current by increasing the width (the length in the depth direction in FIG. 1) of the pinned layer 16 relative to that of the free layer 18. Thus, the relationship among a junction area A1 between the nonmagnetic layer 10 and the pinned layer 14, a junction area A2 between the nonmagnetic layer 10 and the pinned layer 16, and a junction area A3 between the nonmagnetic layer 10 and the free layer 18 is preferably A1>A2>A3.

The magnetic layers included in the pinned layer 14, the pinned layer 16, and the free layer 18 may be formed of, for example, a single material selected from the group consisting of Co, Ni, and Fe, an alloy containing at least one of the above elements (for example, CoFe, CoFeB, CoNiFe, NiFe, CoZrNb, FeN, FeSi, and FeAlSi), a soft magnetic material, or a Heusler alloy selected from the group consisting of, for example, CoFeMnSi, CoFeMnGe, CoFeGaGe, CoFeSi, CoFeGe, CoFeAl, CoMnSi, CoMnGe, and CoMnAl. The magnetization directions of the pinned layer 14 and the pinned layer 16 are pinned to be antiparallel to each other. Therefore, the pinned layer 14 and the pinned layer 16 may have a synthetic pin structure in which antiferromagnetic coupling is caused by using a magnetic coupling layer (for example, a Ru layer).

The pinned layer 14 may include a base layer formed of, for example, a nonmagnetic metal such as Ti, Cu, Ru, Ta, Cr, and Hf. The interface layers 12a, 12b adjacent to the nonmagnetic layer 10 may be formed of, for example, MgO, AlO, GaO, or ZnO.

The antiferromagnetic layers 15, 17 may be formed of, for example, IrMn, PtMn, or RhMn.

The nonmagnetic layer 10 may be formed of a nonmagnetic conductive metal such as Cu, Au, Ag, Al, Ru, and Ir, or an alloy of these materials such as CuZn, CuSi, and CuAl.

As described above, the crystallinity of the nonmagnetic layer 10 and the magnetic layers disposed thereon, i.e., the free layer 18 and the pinned layer 16, can be improved according to the first embodiment. As a result, the degradation of the spin diffusion length of the nonmagnetic layer 10 and the degradation of the spin polarization of the magnetic layers may be prevented. This allows the magnetoresistive element to have a low resistance and a high output.

(Second Embodiment)

Figure 2:
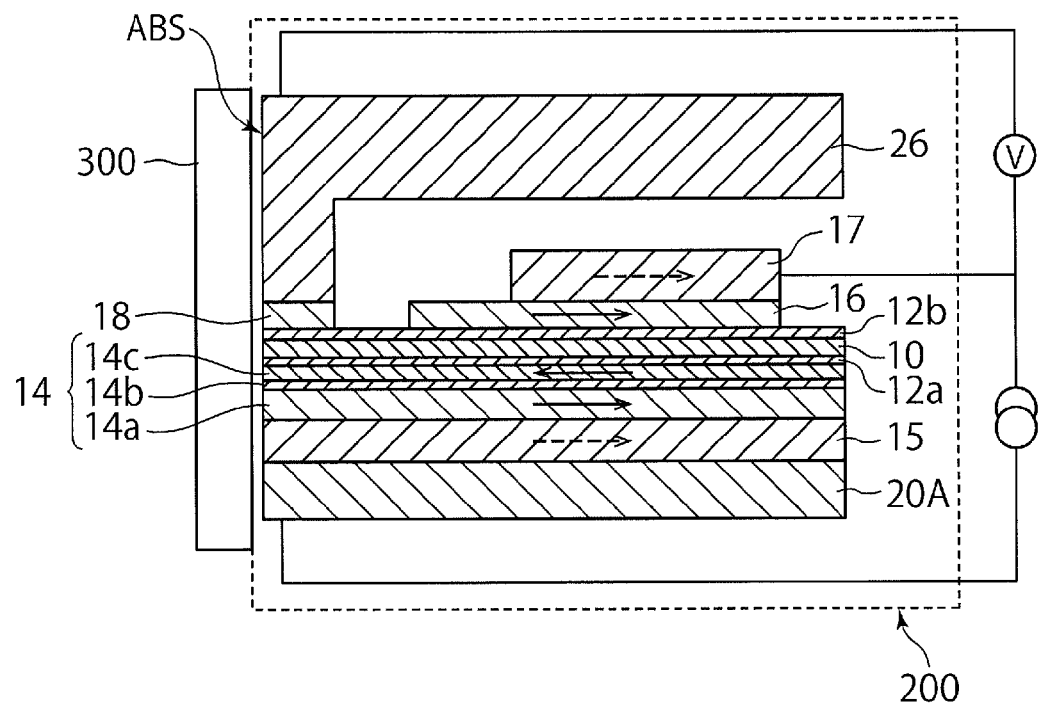
FIG. 2 is a cross-sectional view showing a magnetic reading head according to a second embodiment.

A magnetic reading head according to a second embodiment will be described with reference to FIG. 2. The magnetic reading head according to the second embodiment includes a slider 200 facing a magnetic recording medium 300 as shown in FIG. 2. The slider 200 includes a magnetoresistive element 1A serving as a magnetic reading element. The magnetoresistive element 1A may be obtained by replacing the electrode 20 of the magnetoresistive element 1 shown in FIG. 1 with a magnetic shield 20A, and also replacing the electrodes 22, 24 with the magnetic shield 26. One of the surfaces of the magnetoresistive element 1A facing the magnetic recording medium 300 is an air bearing surface (ABS).

The magnetic shield 20A has the same shape as the electrode 20 shown in FIG. 1. The magnetic shield 26 includes a first portion disposed on the free layer 18, and a second portion connecting to the first portion and extending over the pinned layer 16, i.e., in the direction opposite to the magnetic recording medium 300, so as not to be in contact with the antiferromagnetic layer 17. The second portion of the magnetic shield 26 extends above the antiferromagnetic layer 17.

In the magnetic reading head according to the second embodiment, a current is caused to flow between the pinned layer 14 and the pinned layer 16 to diffuse spin-polarized electrons into the nonmagnetic layer 10. Then, a voltage is detected between the free layer 18, in which the magnetization direction is rotate due to the influence of the external magnetic field from the magnetic recording medium 300, and the pinned layer 16.

As can be understood from the above descriptions, the second embodiment employs a three-terminal structure including a magnetic material connecting to a voltmeter and a current source. The three terminals are the pinned layer 14, the pinned layer 16, and the free layer 18. The spin relaxation length of magnetic materials is considerably shorter than that of nonmagnetic materials. Accordingly, the size of the magnetoresistive element may be considerably reduced by forming all of the terminals with magnetic materials.

The absence of a terminal formed of a nonmagnetic material in the second embodiment allows the spin accumulation effect to be focused on the small nonmagnetic layer 10. This may prevent the spin leakage from the nonmagnetic layer 10, and allow a high output to be obtained.

As described above, the second embodiment is capable of improving the crystallinity of the nonmagnetic layer 10 and the magnetic layers disposed thereon, the free layer 18 and the pinned layer 16, like the first embodiment. As a result, the degradation in the spin diffusion length of the nonmagnetic layer 10 and the degradation in the spin polarization of the magnetic layers may be prevented. This helps to provide a magnetic reading head with a low resistance and a high output.

(Third Embodiment)

Figure 3:
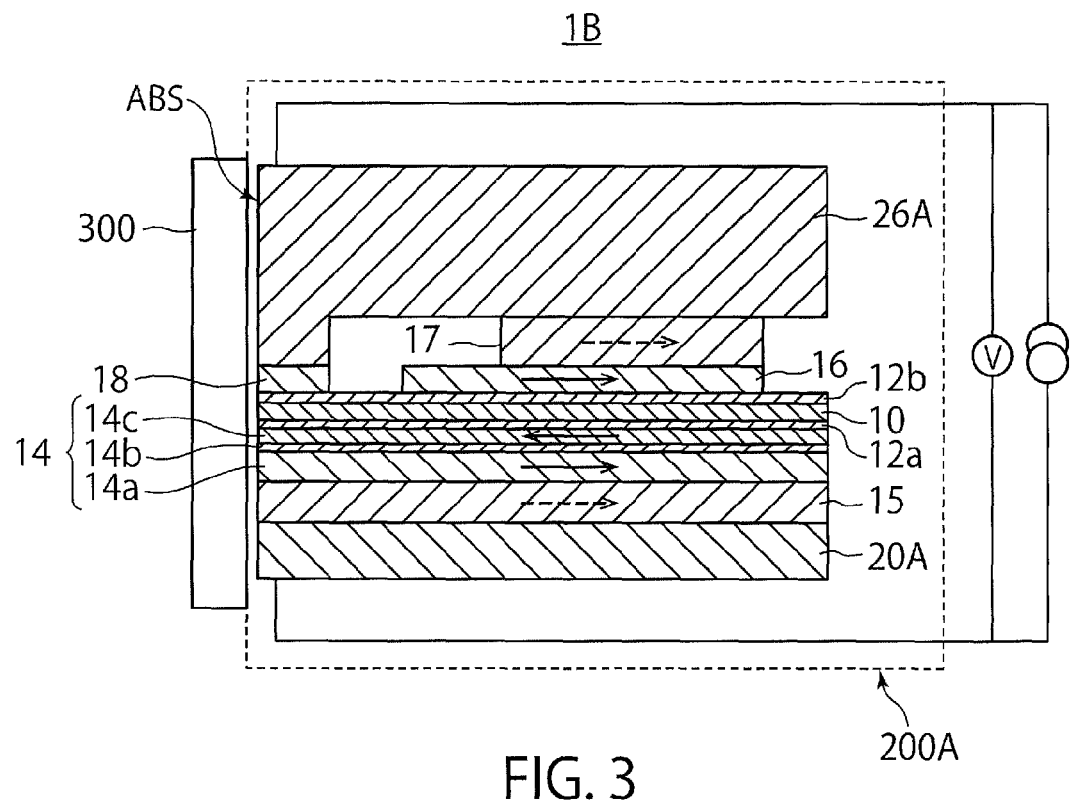
FIG. 3 is a cross-sectional view showing a magnetic reading head according to a third embodiment.

A magnetic reading head according to a third embodiment will be described below with reference to FIG. 3. The magnetic reading head according to the third embodiment includes a slider 200A facing a magnetic recording medium 300 as shown in FIG. 3, the slider 200A including a magnetoresistive element 1B. The magnetoresistive element 1B is obtained by replacing the magnetic shield 26 of the magnetoresistive element 1A shown in FIG. 2 with a magnetic shield 26A.

The magnetic shield 26A includes a first portion disposed on the free layer 18, and a second portion connecting to the first portion and extending over the pinned layer 16, i.e., in the direction opposite to the magnetic recording medium 300, so as to be in contact with the antiferromagnetic layer 17. Thus, the pinned layer 16 and the free layer 18 have a common electrode line. As a result, the magnetic head according to the third embodiment has a two-terminal structure in which all the terminals are formed of magnetic materials.

In the third embodiment, a first current is caused to flow from the pinned layer 14 to the pinned layer 16 via the nonmagnetic layer 10, and a second current that is lower than the first current is caused to flow from the pinned layer 14 to the free layer 18 via the nonmagnetic layer 10. The ratio between the current flowing through the pinned layer 16 and the current flowing through the free layer 18 may be controlled by adjusting the junction areas with the nonmagnetic layer 10 if the areal resistance RA is the same. The ratio may also be controlled by causing the areal resistance of the pinned layer 16 to differ from that of the free layer 18. Since the pinned layer 16 and the free layer 18 have a common electrode line, the output of the third embodiment may become lower than that of the second embodiment having a three-terminal structure as shown in FIG. 2. However, the number of terminals in the third embodiment is the same as that of a magnetic reading head with a local spin valve structure that is currently used. Furthermore, TMR elements that are used as reading elements in prevailing magnetic reading heads suppress the increase in resistance caused by the reduction in the element width performed to improve the TPI density in the track width by means of shunt paths. However, in the third embodiment, the pinned layer 14 and the pinned layer 16 have the function of shunt paths and also apply spin currents. Accordingly, the output may be greater than conventional TMR elements that are used as reading elements without employing the spin accumulation effect.

Like the first embodiment, the third embodiment is capable of improving the crystallinity of the nonmagnetic layer 10 and the magnetic layers formed thereon, i.e., the free layer 18, and the pinned layer 16. As a result, the degradation in the spin diffusion length of the nonmagnetic layer 10 and the degradation in the spin polarization of the magnetic layers may be prevented. This helps to provide a magnetic reading head with a low resistance and a high output.

(Fourth Embodiment)

Figure 4:
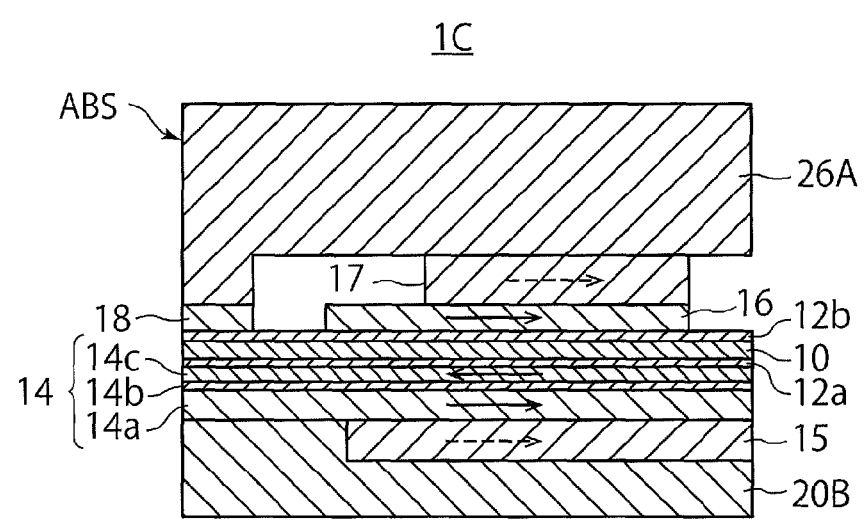
FIG. 4 is a cross-sectional view showing a magnetic reading head according to a fourth embodiment.

A magnetic reading head according to a fourth embodiment will be described below with reference to FIG. 4. The magnetic reading head according to the fourth embodiment includes a magnetoresistive element 1C shown in FIG. 4, which is obtained by disposing the antiferromagnetic layer 15 of the magnetoresistive element 1B shown in FIG. 3 away from the ABS and replacing the magnetic shield 20A with a magnetic shield 20B. The magnetic shield 20B includes a portion corresponding to the magnetic shield 20A, and a portion connecting to the portion corresponding to the magnetic shield 20A and filling the space formed by moving the antiferromagnetic layer 15 away from the ABS.

This structure may cause the magnetic gap or the distance between the magnetic shield 20B and the magnetic shield 26A at the ABS to be narrower as compared to the magnetic gap in the third embodiment, and thus improves the resolution as compared to the third embodiment.

The fourth embodiment is capable of improving the crystallinity of the nonmagnetic layer 10 and the magnetic layers disposed thereon, i.e., the free layer 18 and the pinned layer 16, as in the first embodiment. As a result, the degradation in the spin diffusion length of the nonmagnetic layer 10 and the degradation in the spin polarization of the magnetic layers may be prevented. This helps to provide a magnetic reading head with a low resistance and a high output.

The structure of the fourth embodiment in which the antiferromagnetic layer 15 is moved away from the ABS may also be applied to the magnetoresistive element 1A according to the second embodiment.

(Fifth Embodiment)

A magnetic reading head according to a fifth embodiment will be described below with reference to FIGS. 5A and 5B. The magnetic reading head according to the fifth embodiment may be obtained by replacing the magnetoresistive element 1B of the magnetic reading head according to the third embodiment shown in FIG. 3 with a magnetoresistive element 1D. The magnetoresistive element 1D may be obtained by replacing the free layer 18 of the magnetoresistive element 1B with a free layer 18A. The free layer 18A includes a magnetic layer 18a, in which the magnetization direction can be switched, disposed on the nonmagnetic layer 10, a nonmagnetic layer 18b of Ru, for example, disposed on the magnetic layer 18a, a magnetic layer 18c, in which the magnetization direction can be switched, disposed on the nonmagnetic layer 18b, and an antiferromagnetic layer 18d of IrMn, for example, disposed on the magnetic layer 18c as shown in FIG. 5B. Thus, the free layer 18A has a multilayer ferrimagnetic structure.

A one-directionally biased magnetic field is applied to the magnetic layer 18c by the antiferromagnetic layer 18d in the track width direction. The magnetic reading head according to the fifth embodiment further includes a side shield (not shown) facing the side surface of the magnetoresistive element 1D in the track width direction, in which the initial magnetization direction is pinned. This side shield is magnetically coupled with the upper shield 26A. The magnetization of the side shield is aligned in the track width direction by stacking the upper shield 26A on the antiferromagnetic film of IrMn or the like.

A magnetic field is applied to the magnetic layers 18a and 18c by the side shield. It is preferable that the direction of the magnetic field is substantially parallel to the magnetization direction of the magnetic layer 18a and substantially antiparallel to the direction of the biased magnetic field applied to the magnetization of the magnetic layer 18c, and the magnetic volume of the magnetic layer 18a, i.e., the product of the saturation magnetization Ms and the volume V thereof, is different from the magnetic volume of the magnetic layer 18c. As a result, magnetic fields that are perpendicular to the air bearing surface and opposite to each other are applied the magnetic layer 18a and the magnetic layer 18c in a region where the magnetization direction for medium recording is in transition, and the magnetizations of the magnetic layer 18a and the magnetic layer 18c are rapidly rotated with the antiparallel magnetization relationship being maintained. Thus, even if the distance between the upper shield and the lower shield is long, signals in the medium recording magnetic field transition region can be detected to achieve a high resolution reproduction. A biased magnetic field may be applied by another means substituting for the antiferromagnetic layer 18d to the magnetic layer 18c in a direction opposite to the direction of the side-shield biased magnetic field. The stability in the antiparallel magnetization state in the magnetic layer 18a and the magnetic layer 18c is a key to achieve a high resolution reproduction.

Like the third embodiment, the fifth embodiment is capable of improving the crystallinity of the nonmagnetic layer 10 and the magnetic layers disposed thereon, i.e., the free layer 18, and the pinned layer 16. As a result, the degradation in the spin diffusion length of the nonmagnetic layer 10 and the degradation in the spin polarization of the magnetic layers may be prevented. This helps to provide a magnetic reading head with a low resistance and a high output.

The free layer 18A having a multilayer ferrimagnetic structure of the fifth embodiment may also be applied to the magnetoresistive element 1A of the second embodiment or the magnetoresistive element 1C of the fourth embodiment.

(Sixth Embodiment)

A method of manufacturing a magnetic reading element will be described below with reference to FIGS. 6A to 10D. The sixth embodiment is a method of manufacturing the magnetoresistive element 1B of the third embodiment shown in FIG. 3. FIGS. 6A, 7A, 8A, 9A, and 10A are top views of the magnetoresistive element 1 in the respective manufacturing steps, FIGS. 6B, 7B, 8B, 9B, and 10B are A-A cross-sectional views of the magnetoresistive element 1 in the respective manufacturing steps, FIGS. 6C, 7C, 8C, 9C, and 10C are B-B cross-sectional views of the magnetoresistive element 1 in the respective manufacturing steps, and FIGS. 6D, 7D, 8D, 9D, and 10D are C-C cross-sectional views of the magnetoresistive element 1 in the respective manufacturing steps.

The A-A cross-sections, the B-B cross-sections, and the C-C cross-sections of the respective steps are taken along lines A-A, B-B, and C-C shown in the top views of the corresponding steps.

As shown in FIGS. 6A to 6D, a NiFe layer to serve as a shield and electrode is formed on the substrate (not shown). Thereafter, the top surface of the NiFe layer is flattened by chemical mechanical polishing (CMP) to form the magnetic shield 20. Subsequently, a multilayer film including the antiferromagnetic bias layer 15 of IrMn, for example, the magnetic layer 14 to serve as the pinned layer 14, the nonmagnetic layer 10, the pinned layer 16, and the magnetic layer 19 to serve as the free layer 18 is formed on the magnetic shield 20 by a sputtering method.

Then, the shape of the pinned layer 14 is defined by ion beam etching (IBE) as shown in FIGS. 7A to 7D. A resist pattern with a predetermined shape is used as an etching mask. The resist pattern may be formed by a stepper, electron beams, or nanoimprint. The resist pattern may be transferred to a hard mask in order to improve the aspect ratio in the process. As shown in FIGS. 7A and 7C, an interlayer insulating film or hard bias film 21 may be formed by a lift-off method in a portion where the etching is performed.

Thereafter, the pinned layer 16 and the free layer 18 are separated from each other by the IBE as shown in FIGS. 8A to 8D.

Subsequently, the antiferromagnetic layer 17 of IrMn, for example, is formed on the pinned layer 16 as shown in FIGS. 9A to 9D. The antiferromagnetic layer 17 may be formed on the magnetic layer 19 shown in FIGS. 6A to 6D, and after the pinned layer 16 and the free layer 18 are separated from each other, the antiferromagnetic layer 17 on the free layer 18 may be removed by milling (this process is not shown).

Finally, the top surface is covered by a shield to serve as the electrode as shown in FIGS. 10A to 10D to obtain the structure of the embodiment in which the pinned layer 14 is present under the entire lower surface of the nonmagnetic layer.

Example

Figure 11:
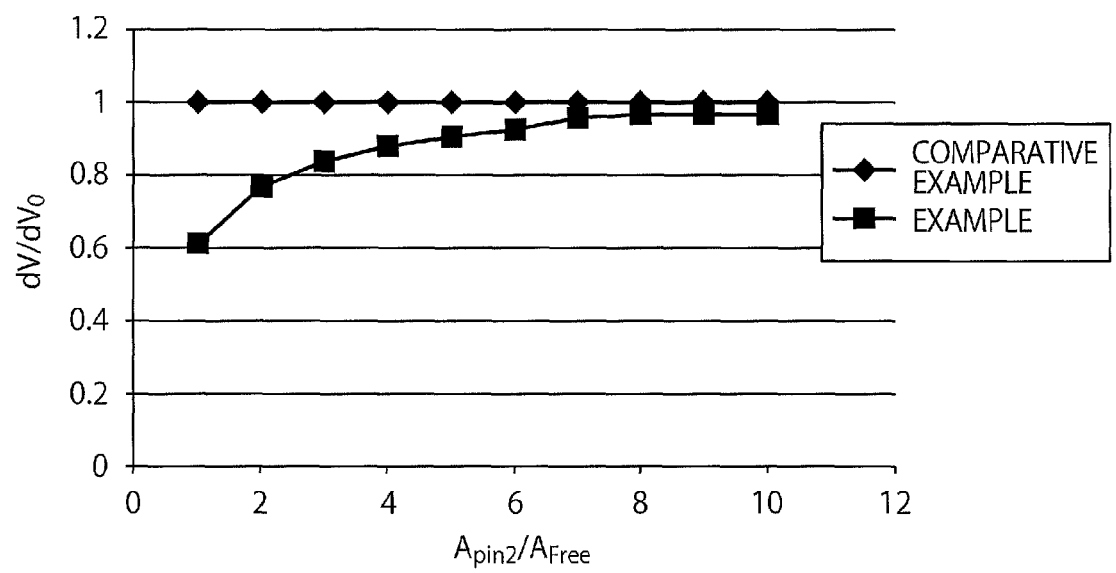
FIG. 11 is a diagram showing the relationship between the area and the output of a pinned layer in which the current density is fixed.

FIG. 11 shows simulation results of three-dimensional models of a magnetic reading head according to the second embodiment serving as Example, and a magnetic reading head serving as Comparative Example, which is obtained by changing the size (planar shape) of the pinned layer 14 disposed below the nonmagnetic layer 10 to be the same as that of the pinned layer 16 disposed above the nonmagnetic layer 10 in the second embodiment. FIG. 11 shows the dependency of the output to the area ratio ($A_{Pin2}/A_{Free}$) when the area ($A_{Free}$) of the free layer 18 is fixed, and the area ($A_{Pin2}$) of the pinned layer 16 disposed on the nonmagnetic layer 10 is changed. The current density is fixed to 160 MA/cm$^2$ and the output of Example is normalized by the output ($dV_0$) of Comparative Example.

As can be understood from FIG. 11, the output reduction rate of the magnetic reading head according to Example is curbed by increasing the area of the pinned layer 16. It is confirmed that the output may become substantially the same as that of Comparative Example by increasing the area of the pinned layer 16 to about ten times the area of the free layer 18. The reason for this is considered to be that the loss of the output caused by the pinned layer 14 below the nonmagnetic layer 10 absorbing the spin current is compensated by the increase in spin current caused by the increase in the length of the pinned layer 16.

The simulation calculates the output in an ideal system, and in an actual case, the interface flatness and the crystallinity of the nonmagnetic layer 10, the pinned layer 16 on the nonmagnetic layer 10, and the free layer 18 of Comparative Example may be worse. Therefore, the decrease in output caused by the degradation of the spin diffusion length in the nonmagnetic layer 10 and the degradation of the spin polarization in the magnetic layers 16, 18 should be considered.

As described above, according to Example, the influence of the loss of spin current can be reduced as compared to Comparative Example by disposing the pinned layer 14 below the entire surface of the nonmagnetic layer 10, and increasing the ratio of the area of the pinned layer 16 to the area of the free layer 18. The reduction in output caused by the degradation of the spin diffusion length in the nonmagnetic layer 10 and the degradation of the spin polarization in the magnetic layers 18, 16 may be controlled in this manner.

(Seventh Embodiment)

A magnetic recording and reading apparatus according to a seventh embodiment will be described below.

The magnetic reading heads according to the second embodiment to the fifth embodiment may be incorporated into, for example, recording and reading type magnetic head assemblies, and further mounted on magnetic recording and reading apparatuses (HDDs). The magnetic recording and reading apparatus according to the seventh embodiment may have only a reading function, and may have both a recording function and a reading function.

Figure 12:
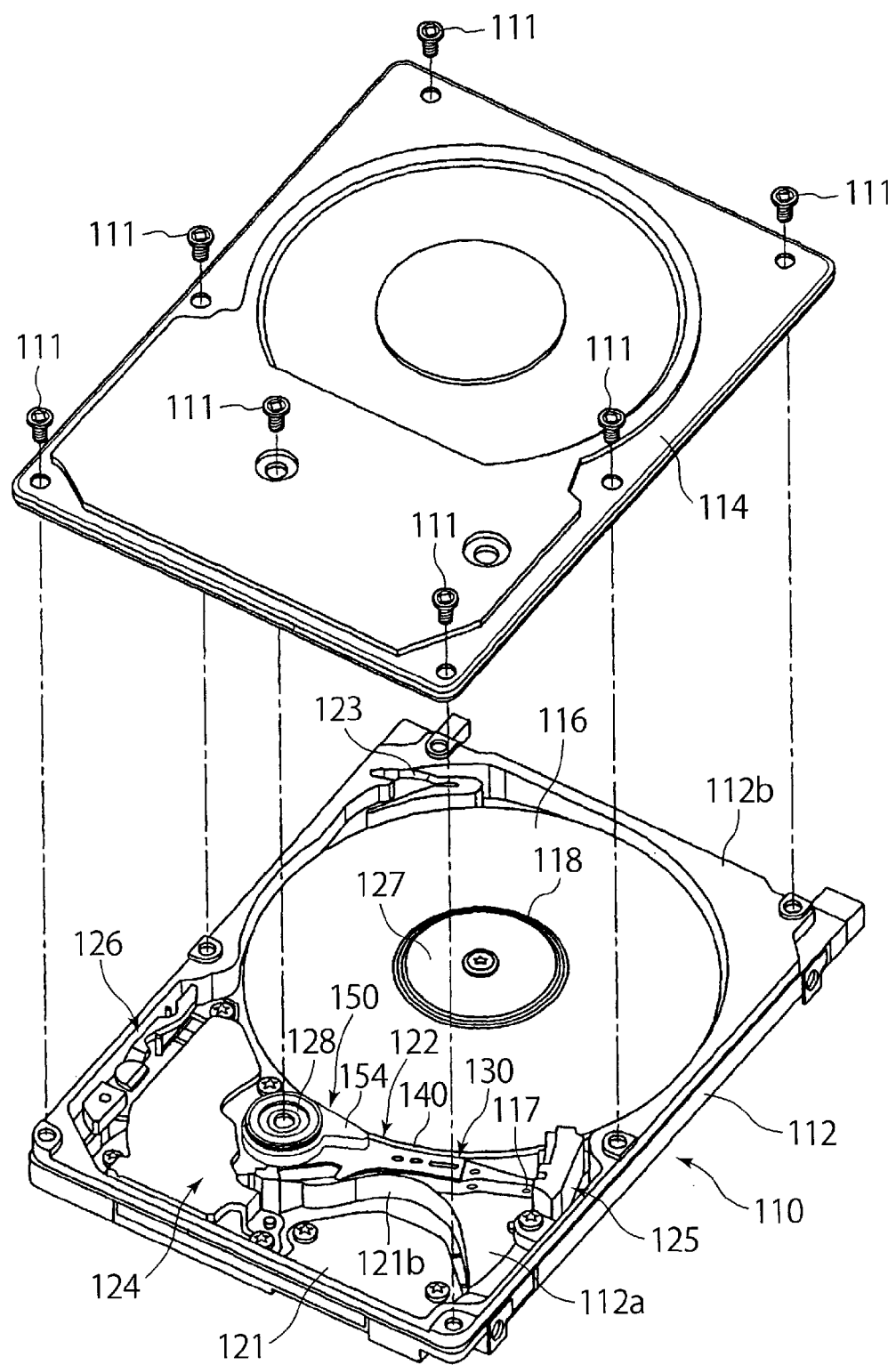
FIG. 12 is a perspective view showing the structure of a magnetic recording and reading apparatus according to a seventh embodiment.

FIG. 12 is a perspective view showing a structure of the magnetic recording and reading apparatus according to the seventh embodiment. As shown in FIG. 12, the magnetic recording and reading apparatus includes a housing 110. The housing 110 includes a base 112 in a rectangular box shape, of which the top surface is open, and a top cover 114 to be fastened to the base 112 by a plurality of bolts 111 to close the opening on the top surface of the base 112. The base 112 includes a bottom plate 112a in a rectangular shape, and a sidewall 112b standing along the periphery of the bottom plate 112a.

The housing 110 houses a magnetic disk 116 serving as a recording medium, and a spindle motor 118 serving as a driving unit for supporting and rotating the magnetic disk 116. The spindle motor 118 is disposed on the bottom plate 112a. The housing 110 has a size enabling the housing of plural, for example two, magnetic disks, and the spindle motor 118 is capable of supporting and driving two magnetic disks.

The housing 110 also houses a plurality of magnetic heads 117 for recording information to and reading information from the magnetic disk 116, a head stack assembly ("HSA") 122 for supporting the magnetic heads 117 so as to be freely moved relative to the magnetic disk 116, a voice coil motor ("VCM") 124 for pivoting and positioning the HSA 122, a ramp loading mechanism 125 for moving and holding the magnetic head 117 at a retracting position that is at a distance from the magnetic disk 116 when the magnetic head 117 reaches the outermost portion of the magnetic disk 116, a latch mechanism 126 for holding the HSA 122 at the retreating position when an impact is given to the HDD, and a substrate unit 121 including a preamplifier. A printed circuit board that is not shown is fastened by bolts to the outer surface of the bottom plate 112a of the base 112. The printed circuit board controls operations of the spindle motor 118, the VCM 124, and the magnetic heads 117 via the substrate unit 121. A circulation filter 123 for capturing dusts within the housing by driving a movable portion thereof is provided to a sidewall of the base 112 at a position outside the magnetic disk 116.

The magnetic disk 116 has a diameter of, for example, 65 mm (2.5 inches), and includes magnetic recording layers under the top surface and above the bottom surface. The magnetic disk 116 is coaxially engaged with a hub (not shown) of the spindle motor 118, and clamped by a clamp spring 127 to be fixed to the hub. In this manner, the magnetic disk 116 is supported to be in parallel with the bottom plate 112a of the base 112. The magnetic disk 116 is rotated by the spindle motor 118 at a predetermined speed, for example, 5400 rpm or 7200 rpm.

Figure 13:
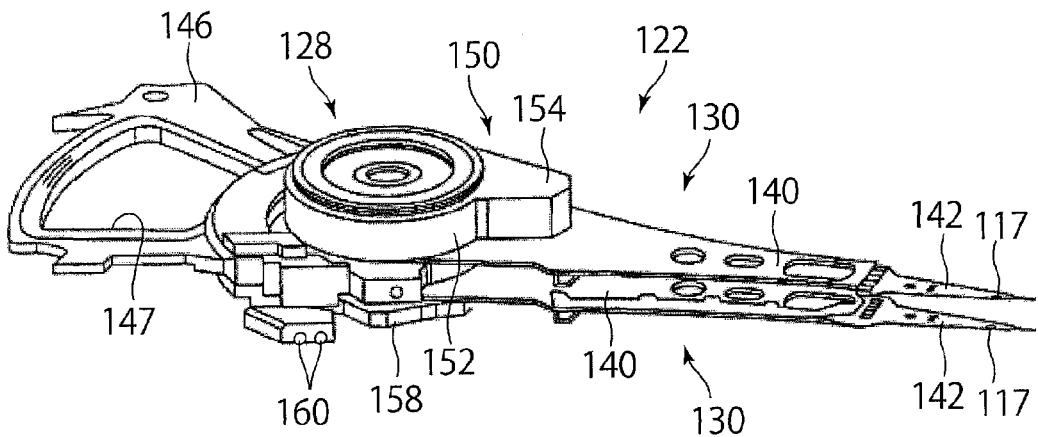
FIG. 13 is a perspective view showing a head stack assembly.
Figure 14:
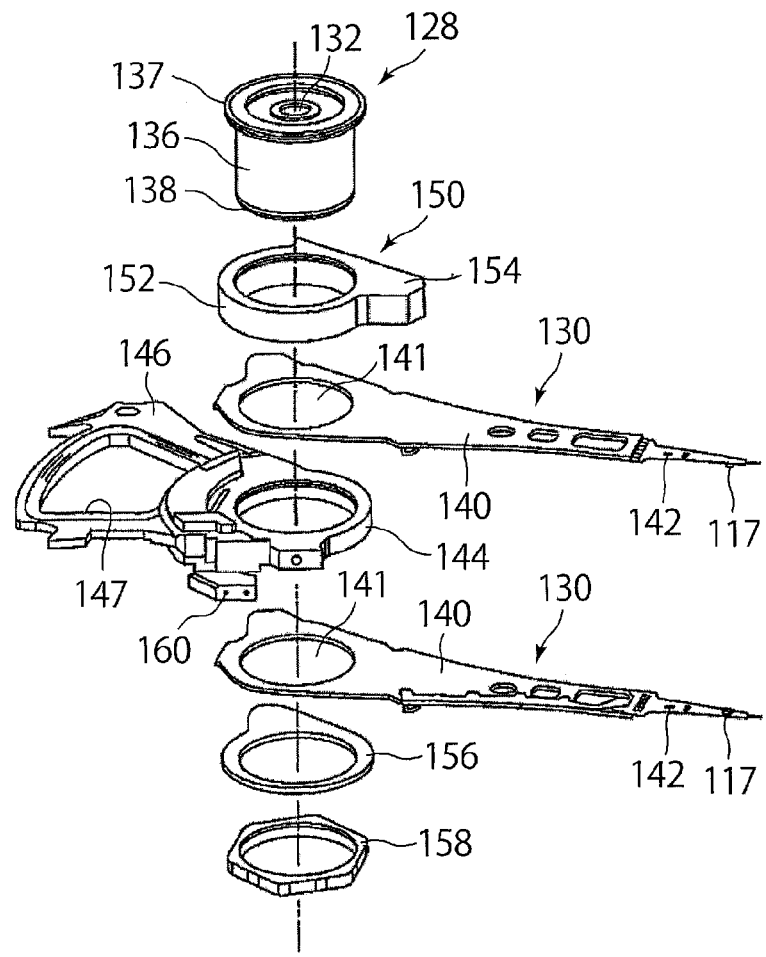
FIG. 14 is an exploded perspective view showing a head stack assembly.

FIG. 13 is a perspective view showing the head stack assembly (HSA) 122 of the magnetic recording and reading apparatus according to the seventh embodiment, and FIG. 14 is an exploded perspective view of the HSA 122. As shown in FIGS. 13 and 14, the HSA 122 includes a bearing unit 128 that can be freely rotated, two head gimbal assemblies ("HGAs") 130 extending from the bearing unit 128, a spacer ring 144 disposed within the HGAs 130, and a dummy spacer 150.

The bearing unit 128 is located along the longitudinal direction of the base 112 at a distance from the rotation center of, and near the outer periphery of the magnetic disk 116. The bearing unit 128 includes a pivot axis 132 standing on the bottom plate 112a of the base 112, and a sleeve 136 in a cylindrical shape, which is coaxially supported by the pivot axis 132 so as to be rotated freely around the pivot axis 132 via the bearings 134. A flange 137 in a ring shape is disposed on the upper portion of the sleeve 136, and a screw portion 138 is formed on the outer periphery of the lower portion. The sleeve 136 of the bearing unit 128 has a size, i.e., a length in the axial direction, sufficiently enough to fix, for example, at maximum of four HGAs and spacers between the adjacent HGAs 140.

In the seventh embodiment, the number of magnetic disk 116 is one. Accordingly, two HGAs 130, which are fewer than the maximum attachable number of four, are fixed to the bearing unit 128. Each HGA 130 includes an arm 140 extending from the bearing unit 128, a suspension 142 extending from the arm, and a magnetic head 117 supported at the extended end of the suspension via a gimbal portion.

The arm 140 has a laminate structure of, for example, stainless steel, aluminum, and stainless steel, and in a thin flat plate shape. A circular through-hole 141 is formed on one end, i.e., the base end thereof. The suspension 142 is formed of a narrow and long leaf spring, the base portion of which is fixed to an end of the arm 140 by spot welding or gluing so that the suspension 142 extends from the arm 140. The suspension 142 and the arm 140 may be integrally formed of the same material.

The magnetic reading head 117 is one of the magnetic reading heads according to the second embodiment to the fifth embodiment, and includes a substantially rectangular slider (not shown) and a recording head formed on the slider. The magnetic reading head 117 is fixed to the gimbal portion formed at a tip portion of the suspension 142. Furthermore, the magnetic reading head 117 includes four electrodes, which are not shown. A relay flexible printed circuit board ("relay FPC") is disposed on the arm 140 and the suspension 142, and the magnetic reading head 117 is electrically connected to a main FPC 121$b$ via the relay FPC.

The spacer ring 144 is formed of aluminum or the like to have a predetermined thickness and a predetermined outside diameter. A support frame 146 of a synthetic resin is integrally formed with the spacer ring 144 and extends outwardly from the spacer ring. A voice coil 147 of the VCM 124 is fixed to the support frame 146.

The dummy spacer 150 includes a spacer body 152 in an annular shape, and a balance adjusting portion 154 extending from the spacer body. The dummy spacer 150 is integrally formed of a metal such as stainless steel. The outside diameter of the spacer body 152 is the same as that of the spacer ring 144.

Therefore, the outside diameter of a portion of the spacer body 152 contacting the arm is the same as the outside diameter of a portion of the spacer ring 144 contacting the arm. The thickness of the spacer body 152 is the sum of the thicknesses of the arms of the HGAs, the number of which is fewer than the maximum number, two in this case, and the thicknesses of the spacer rings disposed therebetween.

The dummy spacer 150, the two HGAs 130, and the spacer ring 144 are engaged with the outer periphery of the sleeve 136 of the bearing unit 128 with the sleeve 136 being inserted into the inner hole of the spacer body 152, the through-hole 141 of the arm 140, and the inner hole of the spacer ring. Thus the dummy spacer 150, the two HGAs 130, and the spacer ring 144 are stacked on the flange 137 along the axial direction of the sleeve. The spacer body 152 of the dummy spacer 150 is engaged with the outer periphery of the sleeve 136 so as to be disposed between the flange 137 and one of the arms 140, and the spacer ring 144 is engaged with the outer periphery of the sleeve 136 so as to be disposed between the two arms 140. A washer 156 in an annular shape is engaged with the lower periphery of the sleeve 136.

The dummy spacer 150, the two arms 140, the spacer ring 144, and the washer 156 engaged with the outer periphery of the sleeve 136 are sandwiched between a nut 158 engaged with the screw portion 138 of the sleeve 136 and the flange 137 to be fixed to the outer periphery of the sleeve.

The two arms 140 are located at predetermined positions in the circumferential direction of the sleeve 136, and extend in the same direction from the sleeve. As a result, the two HGAs are integrally rotated with the sleeve 136, and face each other with a predetermined distance therebetween in parallel with the surface of the magnetic disk 116. The support frame 146 integrally formed with the spacer ring 144 extends from the bearing unit 128 in the opposite direction to the arms 140.

Two terminals 160 in a pin shape project from the support frame 146, and electrically connect to the voice coil 147 via a wiring (not shown) embedded in the support frame 146.

The suspension 142 has lead lines (not shown) for writing and reading signals, which are connected to respective electrodes of the magnetic head incorporated into the slider. Furthermore, an electrode pad (not shown) is provided to the magnetic head assembly 130.

A signal processing unit (not shown) for writing signals to and reading signals from the magnetic recording medium using the magnetic head is provided. The signal processing unit is disposed on the back side of the magnetic recording and reading apparatus shown in FIG. 16. The input and output lines of the signal processing unit are connected to the electrode pad and electrically coupled to the magnetic head.

Thus, the magnetic recording and reading apparatus according to the seventh embodiment includes a magnetic recording medium, any of the magnetic reading heads according to the second to fifth embodiments, a movable unit (movement controller) for separating the magnetic recording medium and the magnetic reading head from each other, or moving the magnetic recording medium and the magnetic reading head relative to each other under a contact state, a position controller for positioning the magnetic reading head at a predetermined recording position of the magnetic recording medium, and a signal processing unit for writing signals to and reading signals from the magnetic recording medium using the magnetic reading head. The recording medium disk 116 can be used as the aforementioned magnetic recording medium. The aforementioned movable unit may include a slider. Furthermore, the aforementioned position controller may include an HSA 122.

When the magnetic disk 116 is rotated, and the actuator arm 140 is caused to pivot by the voice coil motor 124 to load the slider onto the magnetic disk 116, the air bearing surface (ABS) of the slider on which the hard disk head is mounted is held above the surface of the magnetic disk 116 at a predetermined floating distance therefrom. In this manner, the information recorded on the magnetic disk 116 is read based on the aforementioned principle.

The magnetic recording and reading apparatus according to the seventh embodiment, which uses any of the magnetic reading heads according to the second to sixth embodiments, is capable of increasing the output voltage, and decreasing the gap between shields.

A magnetic reading head according to a first aspect comprises: the magnetoresistive element according to the second embodiment to serve as a reading element, a current being caused to flow between the first magnetic layer and the second magnetic layer, and a voltage between the second magnetic layer and the third magnetic layer being measured.

A magnetic reading head according to a second aspect comprises: the magnetoresistive element according to the third embodiment to serve as a reading element, a current being caused to flow between the first magnetic layer and the second magnetic layer and between the first magnetic layer and the third magnetic layer, and a voltage between the first magnetic layer and the third magnetic layer being measured.

A magnetic head assembly according to a third aspect comprises: the magnetic reading head described above; a head slider with the magnetic reading head; a suspension on one end of which the head slider is mounted; and an actuator arm connecting to the other end of the suspension.

A magnetic recording apparatus according to a fourth aspect comprises: a magnetic recording medium; the magnetic head assembly according to the third aspect; and a signal processing unit configured to write signals to and read signals from the magnetic recording medium using the magnetic reading head of the magnetic head assembly.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A magnetoresistive element comprising:
a multilayer element including a first magnetic layer, a magnetization direction of the first magnetic layer being pinned, a nonmagnetic layer disposed on the first magnetic layer, a second magnetic layer disposed in a first region on the nonmagnetic layer, a magnetization direction of the second magnetic layer being pinned and antiparallel to the magnetization direction of the first magnetic layer, and a third magnetic layer disposed in a second region that is different from the first region on the nonmagnetic layer near one of two opposite end faces of the nonmagnetic layer, a magnetization direction of the third magnetic layer being changeable by an external magnetic field,
a lower face of the nonmagnetic layer being in contact with an upper face of the first magnetic layer,
wherein A1 is a junction area between the nonmagnetic layer and the first magnetic layer, A2 is a junction area between the nonmagnetic layer and the second magnetic layer, and A3 is a junction area between the nonmagnetic layer and the third magnetic layer, and a relationship of A1>A2>A3 is satisfied.

2. The magnetoresistive element according to claim 1, further comprising: a first interface layer disposed between the first magnetic layer and the nonmagnetic layer, a second interface layer disposed between the second magnetic layer and the nonmagnetic layer, and a third interface layer disposed between the third magnetic layer and the nonmagnetic layer.

3. The magnetoresistive element according to claim 1, further comprising a first magnetic shield and a second magnetic shield disposed to sandwich the multilayer element, the first magnetic shield connecting to the first magnetic layer, and the second magnetic shield connecting to the third magnetic layer.

4. The magnetoresistive element according to claim 3, further comprising:

a first antiferromagnetic layer disposed between the first magnetic shield and the first magnetic layer to pin the magnetization direction of the first magnetic layer; and
a second antiferromagnetic layer disposed on the second magnetic layer to pin the magnetization direction of the second magnetic layer,
wherein the second antiferromagnetic layer is disposed to be away from the one of the two opposite end faces of the nonmagnetic layer, and the second magnetic shield extends into a space between the second antiferromagnetic layer and the one of the two opposite end faces.

5. The magnetoresistive element according to claim 3, wherein the third magnetic layer includes a multilayer structure with layers of at least a first magnetic material, a nonmagnetic material, and a second magnetic material, a magnetization of the first magnetic material and a magnetization of a second magnetic material being antiparallel to each other, an output signal being obtained when the magnetizations are rotated in response to an external magnetic field.

6. The magnetoresistive element according to claim 3, further comprising:
a first antiferromagnetic layer disposed between the first magnetic shield and the first magnetic layer to pin the magnetization direction of the first magnetic layer; and
a second antiferromagnetic layer disposed on the second magnetic layer to pin the magnetization direction of the second magnetic layer,
wherein the second magnetic shield extends above the second antiferromagnetic layer.

7. The magnetoresistive element according to claim 3, further comprising:
a first antiferromagnetic layer disposed between the first magnetic shield and the first magnetic layer to pin the magnetization direction of the first magnetic layer; and
a second antiferromagnetic layer disposed on the second magnetic layer to pin the magnetization direction of the second magnetic layer,
wherein the second magnetic shield connects to the second antiferromagnetic layer.

8. A magnetic reading head comprising the magnetoresistive element according to claim 1 to serve as a reading element,
a current being caused to flow between the first magnetic layer and the second magnetic layer so that spin electrons are accumulated in the nonmagnetic layer, and a voltage being measured between the second magnetic layer and the third magnetic layer.

9. The magnetoresistive element according to claim 1, wherein the first magnetic layer includes a first magnetic sub-layer, a second magnetic sub-layer, and a magnetic coupling sub-layer disposed between the first magnetic sub-layer and the second magnetic sub-layer, a magnetization of the first magnetic sub-layer and a magnetization of a second magnetic sub-layer being antiparallel to each other.

* * * * *